United States Patent [19]
Lee

[11] Patent Number: 6,049,457
[45] Date of Patent: Apr. 11, 2000

[54] DEVICE FOR FASTENING A HEAT DISSIPATOR TO A CENTRAL PROCESS UNIT

[76] Inventor: Lien-Jung Lee, No. 254, Chungcheng Rd., Luchou City, Taipei Hsien, Taiwan

[21] Appl. No.: 09/346,658

[22] Filed: Jul. 1, 1999

[51] Int. Cl.[7] ...................................................... H05K 7/20
[52] U.S. Cl. .......................... 361/704; 361/707; 361/709; 361/710; 257/718; 257/719; 257/727; 174/16.3; 165/80.3; 165/185
[58] Field of Search .................................. 361/695, 697, 361/704, 707, 709, 710; 165/80.2, 80.3, 185; 174/16.1, 16.3; 257/706, 707, 718, 719, 727

[56] References Cited

U.S. PATENT DOCUMENTS

| | | | |
|---|---|---|---|
| 5,771,960 | 6/1998 | Lin | 165/80.3 |
| 5,828,553 | 10/1998 | Chiou | 361/704 |
| 5,870,288 | 2/1999 | Chen | 361/704 |
| 5,959,350 | 9/1999 | Lee et al. | 257/712 |
| 5,973,921 | 10/1999 | Lin | 361/695 |

*Primary Examiner*—Leo P. Picard
*Assistant Examiner*—Boris L. Chervinsky
*Attorney, Agent, or Firm*—Abelman, Frayne & Schwab

[57] ABSTRACT

A device which can effectively fasten a heat dissipator to a CPU by a simple operation is disclosed. The device includes a pair of fasteners respectively received in a corresponding channel defined in a surface of the heat dissipator, each fastener being configured as a strip and having a first arm and a second arm respectively extending from two ends thereof. A pair of control bars each has a first end engaged with the first arm of the corresponding fastener and a second end engaged with the second arm of a corresponding fastener. A driving lever two separated arms respectively engaged with the first arms of the pair of fasteners. The driving lever is operable to drive the control bar, thereby enabling the fasteners to grippingly secure the heat dissipator to the CPU.

6 Claims, 8 Drawing Sheets

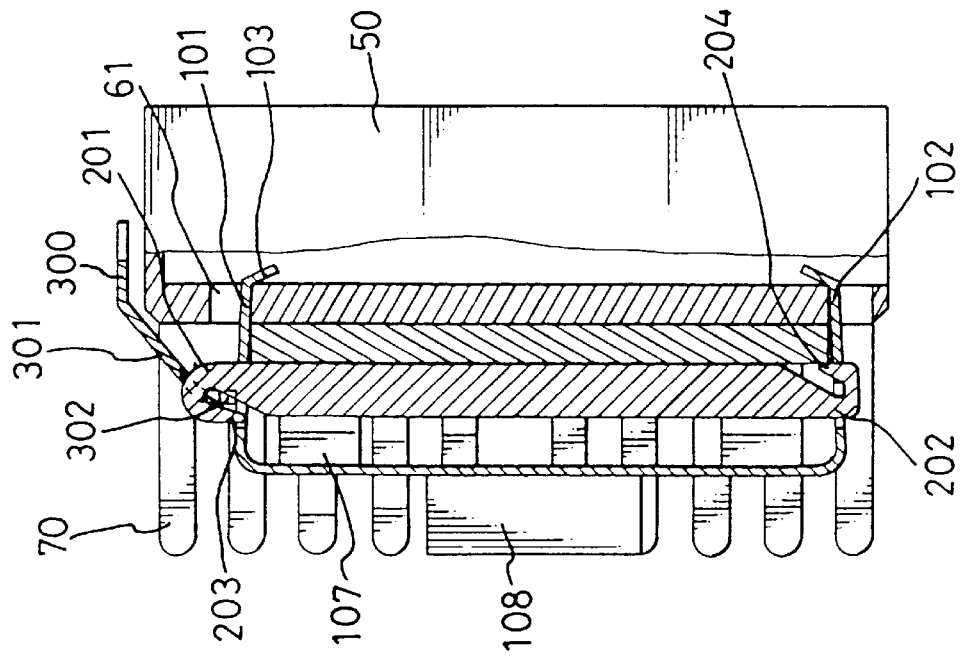
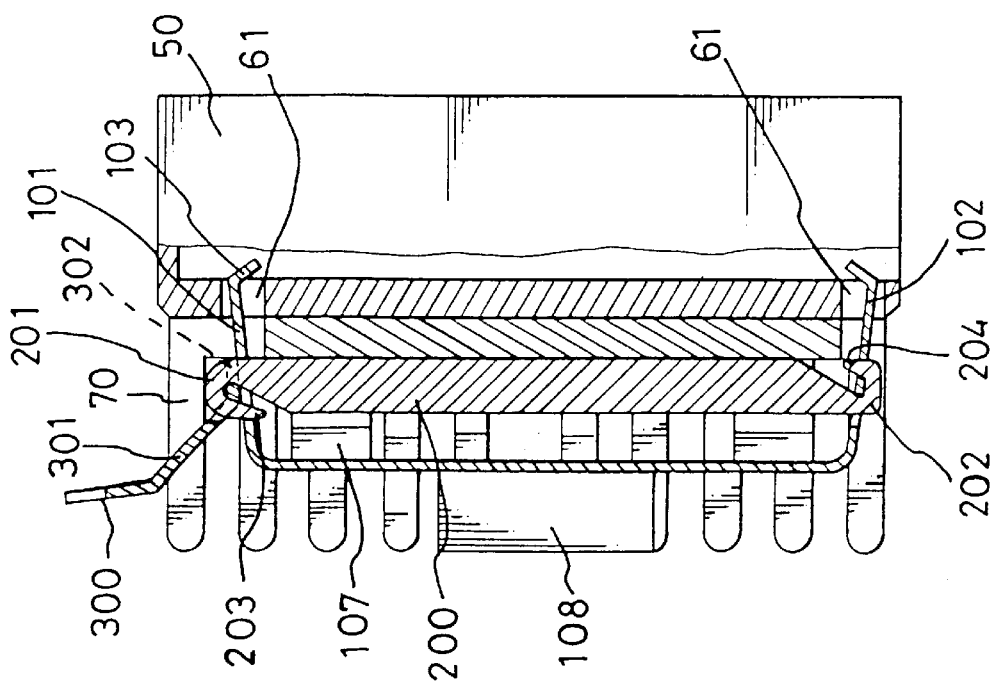

DEVICE FOR FASTENING A HEAT DISSIPATOR TO A CENTRAL PROCESS UNIT

BACKGROUND OF THE INVENTION

1. Field of the Invention

The present invention relates to a device for fastening a heat dissipator to a central processing unit (CPU), and more particularly to a device which is small in size and can effectively fasten a heat dissipator to a CPU by a simple operation.

2. Description of Related Art

FIG. 8 and FIG. 9 show a conventional device for fastening a heat dissipator 70 to a central processing unit (CPU) 50, such as a Pentium II™. The CPU 50 is typically received in a case. A surface of the case serves as a heat radiating surface 60, which defines a plurality of elliptical holes 61 and a plurality of screw holes 62 therein. The heat dissipator 70 has a plurality of fins extending from a surface thereof and defines a plurality of notches 73 in two opposed side edges thereof. Each notch 73 corresponds to and aligns with one of the elliptical holes 61. The device includes a pair of fasteners 10 each configured as a strip and defining an orifice 11 therein. A first arm 12 and a second arm 13 respectively extend from two distal ends of the fastener 10. The first arm 12 and the second arm 13 respectively have a curved portion (not numbered) extending through corresponding notches 73 and received in corresponding elliptical holes 61. The fastener 10 further has a [-shaped strip 20 mounted to a side face thereof. The [-shaped strip 20 defines a bore 21 therein aligning with the orifice 11. Referring to FIG. 9, the device further includes a bolt 30 extending through the orifice 11 and against the bore 21. When the bolt 30 is screwed in, the fastener 10 will be moved away from the [-shaped strip 20, whereby the first arm 12 and the second arm 13 will be urged toward each other. In this way, the curved portions of the first arm 12 and the second arm 13 can be grippingly received in the elliptical hole 61, thereby securing the heat dissipator 70 to the CPU 50.

This kind of device has a disadvantage that the bolt 30 is relatively long such that it may interfere with assembly of a fan which is intended to be mounted on the surface of the heat dissipator 70. Furthermore, it is inconvenient to operate the bolt 30 after the fan is mounted onto the heat dissipator 70.

The present invention provides an improved device for fastening a heat dissipator to a CPU to mitigate and/or obviate the aforementioned problems.

SUMMARY OF THE INVENTION

The main object of the present invention is to provide a device which can effectively fasten a heat dissipator to a central processing unit by a simple operation.

Another object of the present invention is to provide a device for fastening a heat dissipator to a CPU, which is small in size.

Other objects, advantages and novel features of the invention will become more apparent from the following detailed description when taken in conjunction with the accompanying drawings.

BRIEF DESCRIPTION OF THE DRAWINGS

FIG. 3 is a partial sectional side view showing the device before operation according to the present invention;

FIG. 4 is a partial sectional side view showing the device after operation according to the present invention;

DETAILED DESCRIPTION OF PREFERRED EMBODIMENT

Figure 1:
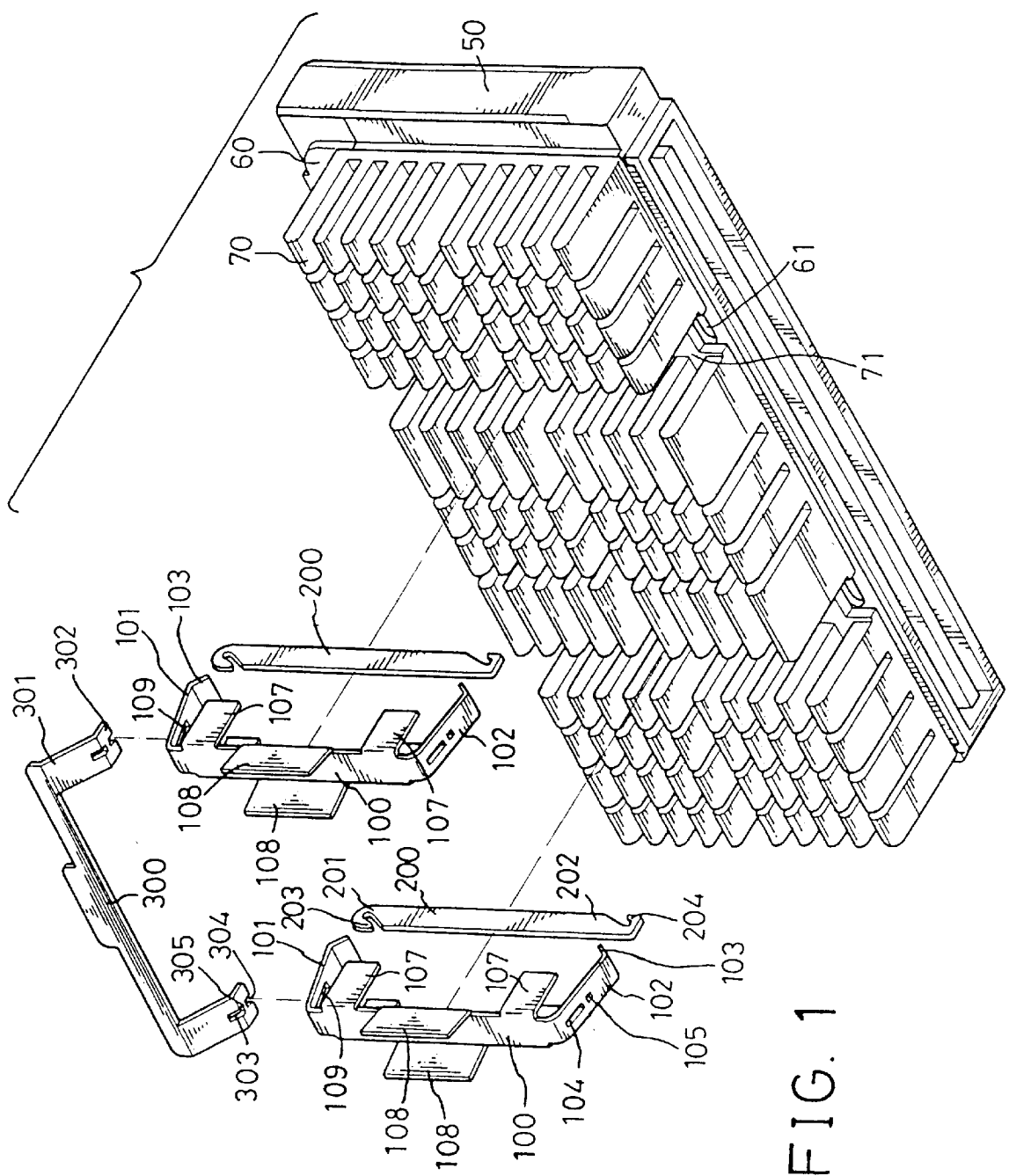
FIG. 1 is an exploded perspective view showing a device for fastening a heat radiating fin to a CPU according to a first preferred embodiment of the present invention.
Figure 2:
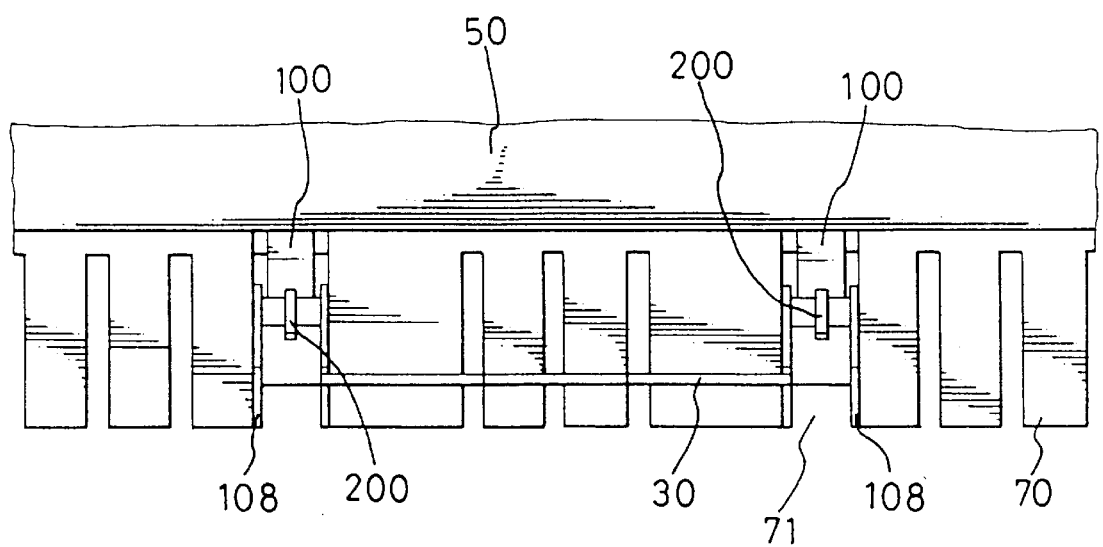
FIG. 2 is a top view showing the device after fastening the heat dissipator to the CPU.

FIG. 1 shows a device for fastening a heat dissipator 60 to a CPU 50 according to a first preferred embodiment of the present invention. The heat dissipator 60 disposed on the CPU 50 includes a plurality of fins 70 extending from a surface thereof and two spaced channels 71 defined between the plurality of fins 70. The heat dissipator 60 further defines a pair of through holes 61 in the bottom face defining each channel 71. A pair of elliptical holes (not shown) are defined in a surface of the CPU 50 to correspond to the pair of the through holes 61.

The device for fastening the heat dissipator 60 to the CPU 50 includes a pair of fasteners 100 respectively corresponding to one of the two spaced channels 71. Since the pair of fasteners 100 are symmetrically arranged and the structure thereof are symmetrically identical, only one of the pair of the fasteners 100 is described below. The fastener 100 is configured as a strip and having a first arm 101 and a second arm 102 respectively extending from two ends thereof. The first arm 101 and the second arm 102 are slightly resilient and respectively have a curved portion 103 formed on a tip thereof to extend through the pair of through holes 61 and be engageably received in the corresponding elliptical holes of the CPU 50. The second arm 102 defines therein a slot 104 and an orifice 105 proximate the slot 104. The first arm 101 defines therein a long hole 109. Two pairs of plates 107 respectively extend downward from two side edges of the fastener 100 toward the heat dissipator 60 to urge a surface of the heat dissipator 60 and closely attach it to the surface of the CPU 50, after the fastener 100 has been engaged with the CPU 50. The fastener 100 further has a pair of wings 108 inclinedly and upwardly extending from the two side edges of the fastener 100 to abut the fins 70 located at two sides of the corresponding channel 71, after the fastener 100 has been placed in the channel 71.

The device of the present invention for fastening the heat dissipator 60 to the CPU 50 further includes a pair of control means 200 respectively engaged with the pair of fasteners 100. As the pair of control means 200 has the same structure, only one is described hereinafter. The control means 200 is configured as a strip and has a first end 201 and a second end 202. The first end 201 has a first hook 203 formed thereon and the second end 202 has a second hook 204 formed thereon and extending in a direction opposite to the direction of the first hook 203. The second hook 204 extends through the slot 104 of the fastener 100 and is engageably received in the orifice 105 of the second arm 102 of the fastener 100, as shown in FIG. 3.

The device for fastening the heat dissipator 60 to the CPU 50 further includes a driving means 300 for driving the pair of control means 200, thereby driving the pair of fasteners 100. The driving means 300 is configured as a transverse strip and has a pair of arms 301 inclinedly extending from one side edge thereof to respectively correspond to the first arms 101 of the pair of fasteners 100. Each arm 301 defines an aperture 303 in a distal end thereof and has a curved portion 302 formed on the distal end. The curved portion 302 defines a cutout 304 in a tip thereof. A spacer 305 is formed between the aperture 303 and the cutout 304 such that the first hook 203 of the control means 200 can extend through the long hole 109 of the fastener 100 and the cutout 302, and then be engageably received in the aperture 303, thereby engaging the arm 301 of the driving means 300 with the first arm 101 of the fastener 100, as shown in FIG. 3.

Referring to FIG. 3, in a normal state, the first arm 101 and the second arm 102 of each fastener 100 respectively extends through a corresponding through hole 61 of the heat dissipator 60 and a corresponding elliptical hole of the CPU 50. Referring to FIG. 4, when pushing the driving means 300 toward the CPU 50, the curved portions 302 of each arm 301 of the driving means 300 will urge the first arm 101 of each fastener 100 and enable the curved portion 103 to be grippingly received in a corresponding elliptical hole of the CPU 50. Meanwhile, the first end 201 of each control means 200 will be pulled up by the driving means 300 and therefore the second arm 102 of the fastener 100 will be driven by the second end 202 of the control means 200 to be grippingly received in a corresponding elliptical hole of the CPU 50.

Figure 5:
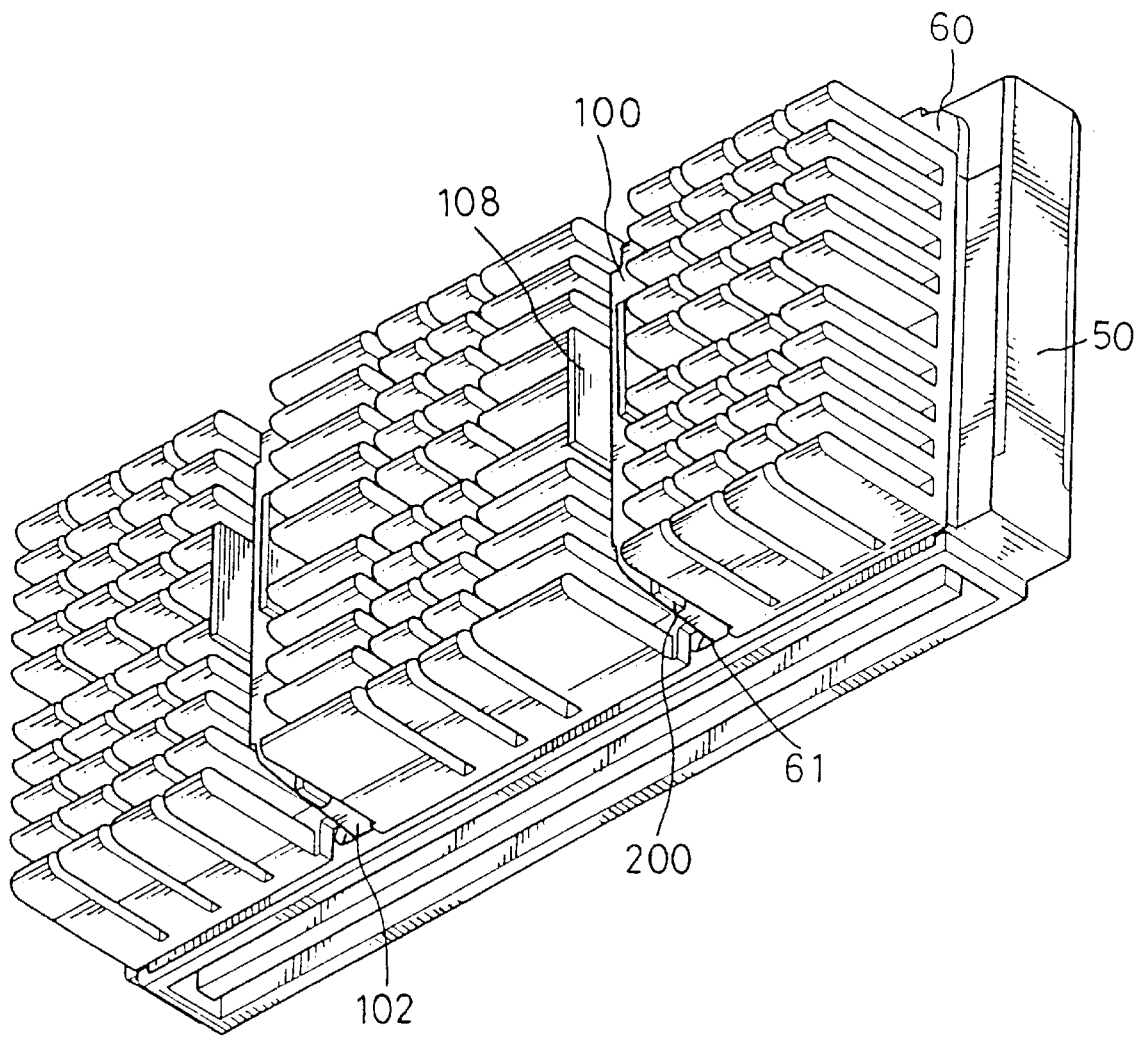
FIG. 5 is a perspective view showing the device applied on the heat dissipator and the CPU according to the present invention.

It is appreciated that the device of the present invention can simultaneously control two fasteners 100 by a simple operation in order to secure a heat dissipator 60 to a CPU 50. Moreover, the device occupies a small area on the heat dissipator 60 as the driving means 300 can be located to attach to a side face of the CPU 50 after operation, as shown in FIG. 5.

Figure 6:
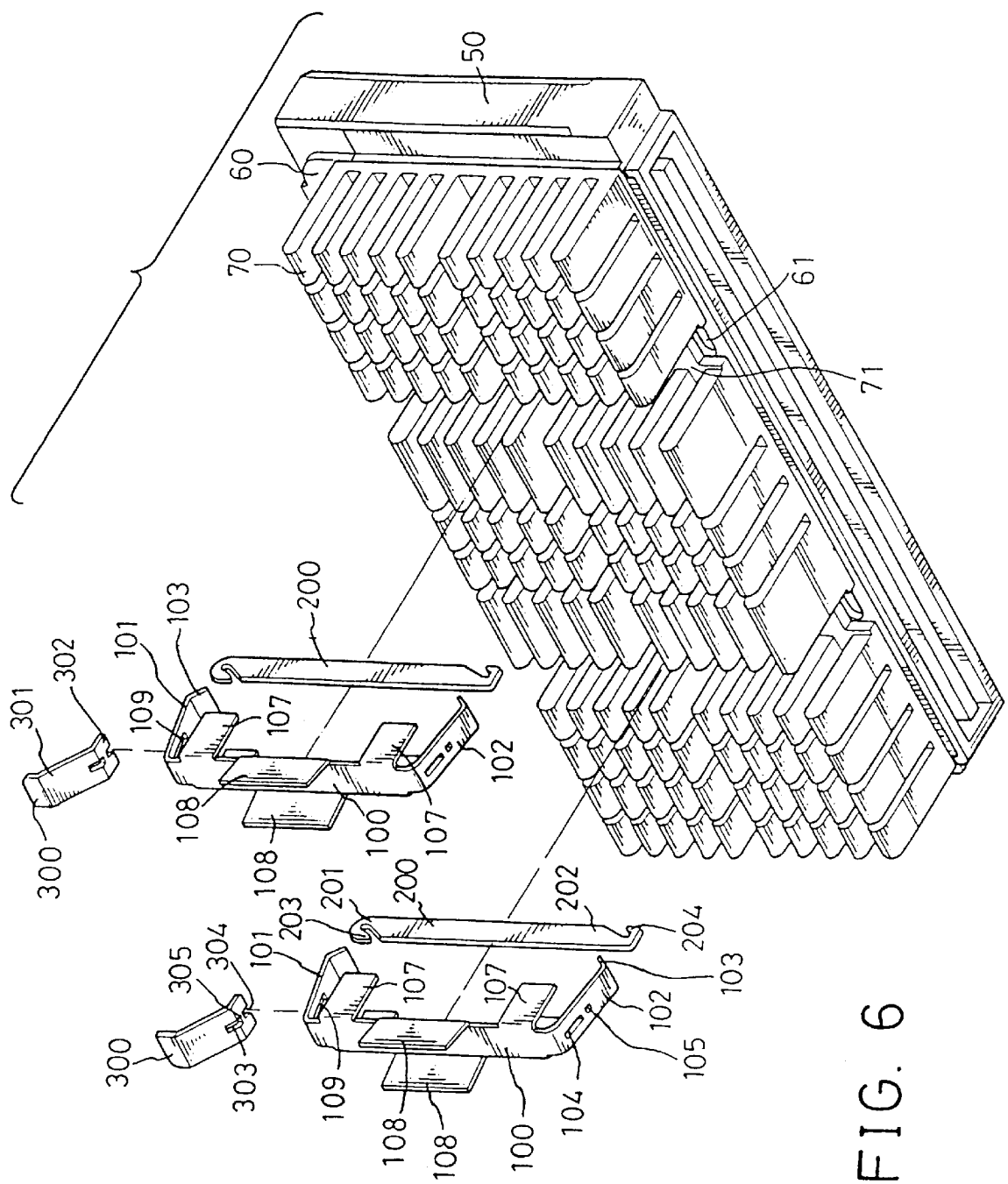
FIG. 6 is an exploded perspective view showing a second preferred embodiment of the device according to the present invention.

FIG. 6 shows a second preferred embodiment of the present invention. In this embodiment, the device has a structure similar to that of FIG. 1, except that the device has two separated driving means 300 to control two fasteners 100 respectively. Each of the two separated driving means 300 is configured as a sheet and defines a first end and a second end. The first end of the sheet is bent to facilitate a user's operation. The second end defines an aperture 303 therein and has a curved portion 302 formed thereon. The curved portion 302 defines a cutout 304 in a tip thereof. A spacer 305 is formed between the aperture 303 and the cutout 304 such that a first hook 203 of a control means 200 can engage the driving means 300 with a first arm 101 of a corresponding fastener 100 in a manner described in the first embodiment of FIG. 1. In operation, by respectively urging the first end of each driving means 300 toward the CPU 50, the same effect of fastener as that of the first embodiment can be obtained.

Figure 7:
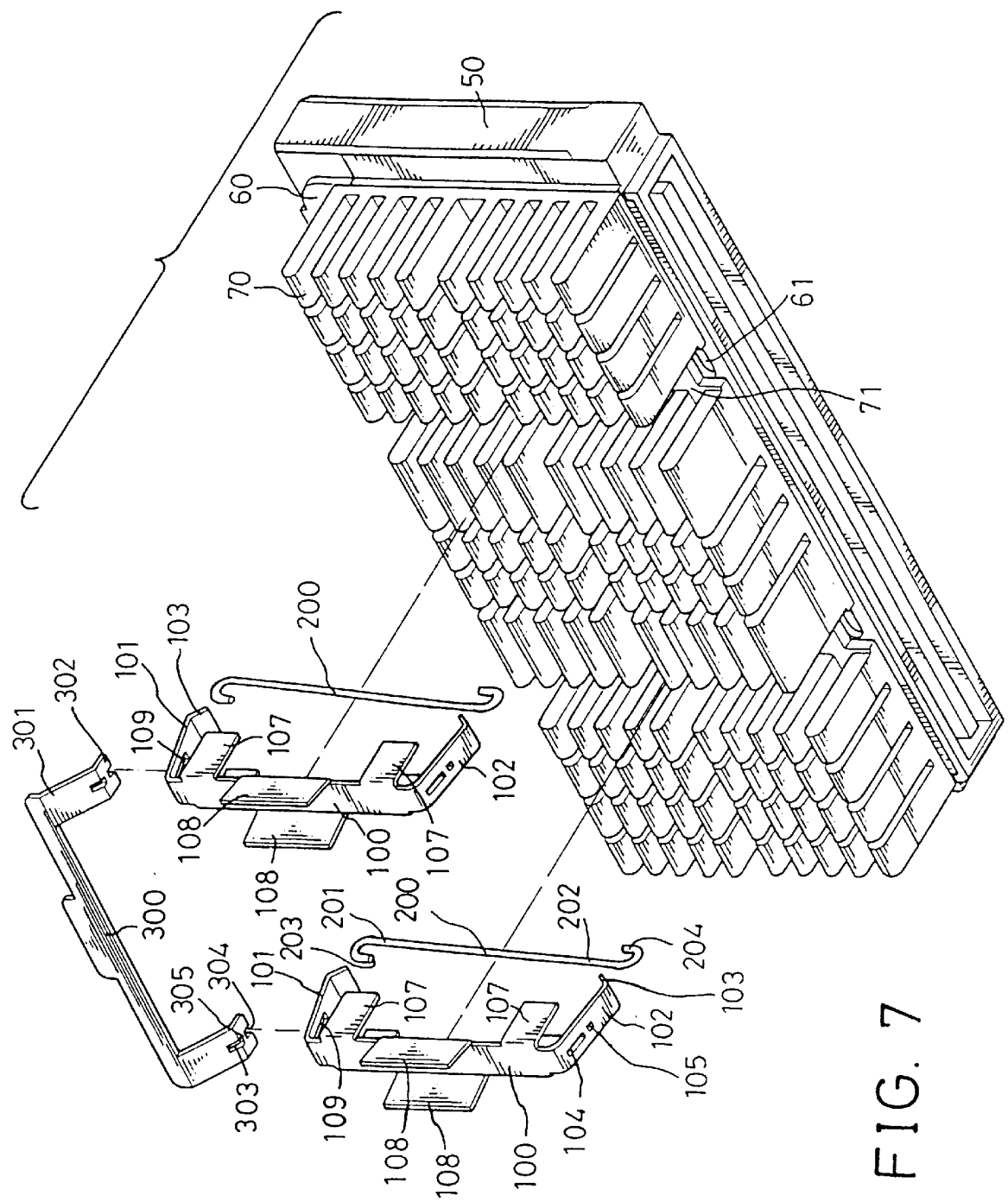
FIG. 7 is an exploded perspective view showing a third preferred embodiment of the device according to the present invention.
Figure 8:
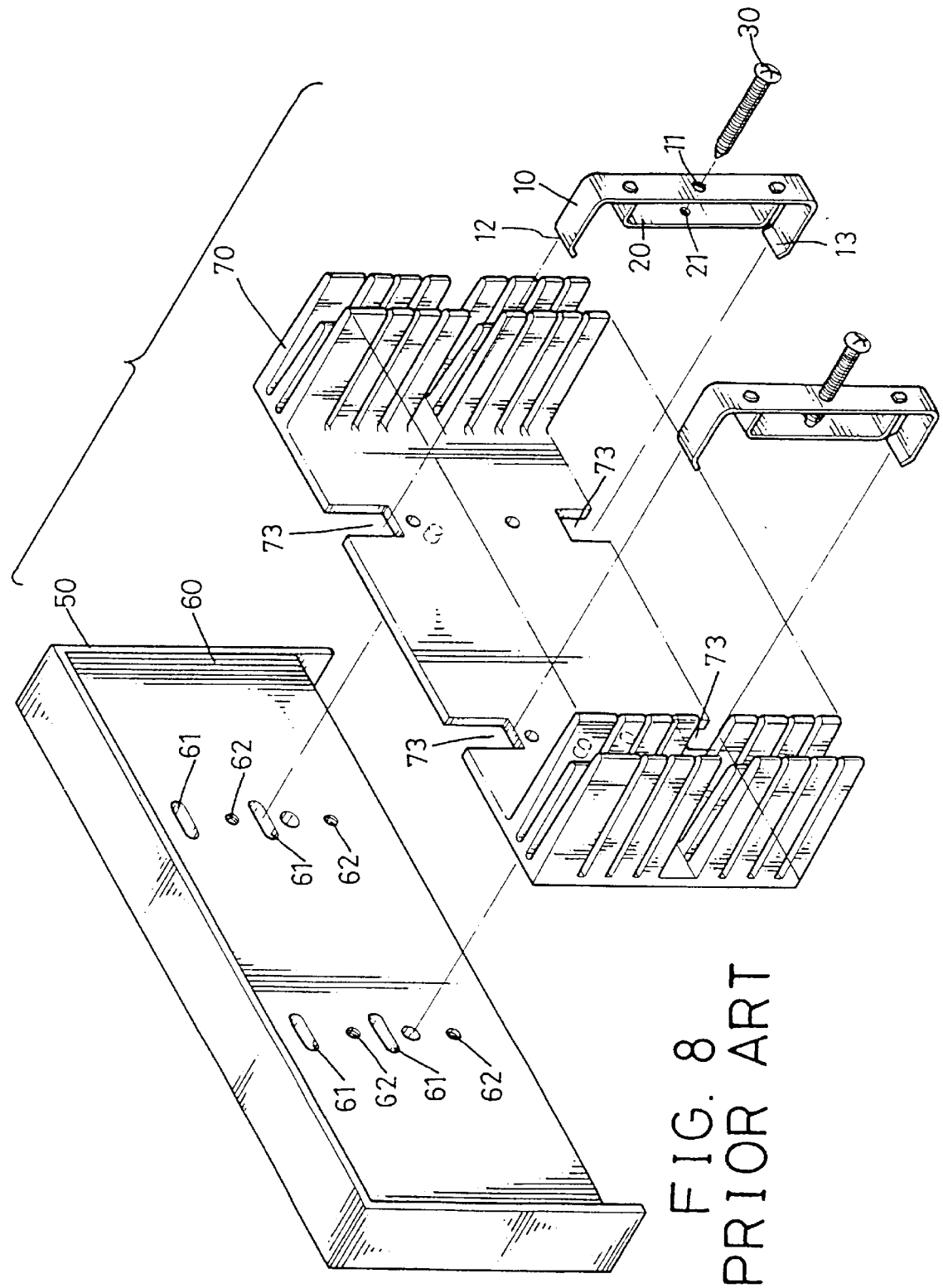
FIG. 8 is an exploded perspective view showing a conventional device for securing a heat radiating fin to a CPU.
Figure 9:
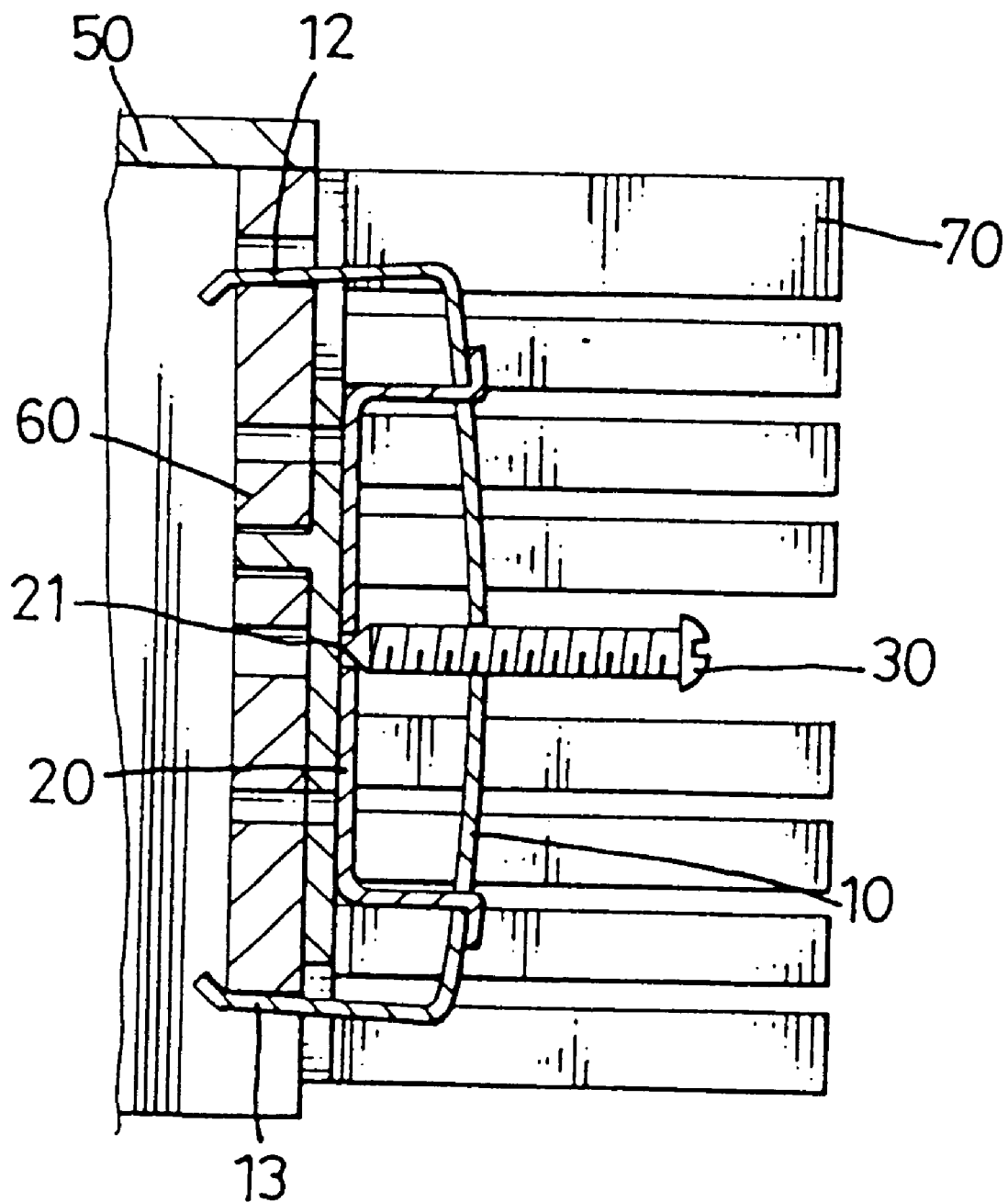
FIG. 9 is a sectional side view showing the conventional device applied to the heat radiating fin and the CPU.

FIG. 7 shows a third preferred embodiment of the present invention. In this embodiment, the device has a structure similar to that of FIG. 1, except that a pair of control means 200 is respectively configured as a bar. Each of the pair of control means 200 defines a first end 201 having a first hook 203 integrally formed thereon, and a second end 202 having a second hook 204 integrally formed and extending in a direction opposite to the direction of the first hook 203. With this arrangement, the control means 200 obtains a same effect as the first embodiment of FIG. 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A device fastening a heat dissipator to a CPU, said heat dissipator having two spaced channels defined between a plurality of fins extending from a surface of the heat dissipator, a bottom face defining each channel having a pair of through holes defined therein, said CPU having a pair of elliptical holes defined in a surface thereof and aligning with the pair of through holes of the heat dissipator, said device comprising:

a pair of fasteners respectively received in a corresponding channel of the heat dissipator, each fastener being configured as a strip and having a first arm and a second arm respectively extending from two ends thereof, said first arm and second arm respectively having a curved portion formed on a tip thereof to extend through the pair of through holes and engage with the corresponding elliptical holes of the CPU, said second arm defining therein a slot and an orifice proximate the slot, said first arm defining therein a long hole;

a pair of control means respectively engaged with the pair of fasteners, each control means having a first end and a second end, said first end having a first hook formed thereon, said second end having a second hook extending in a direction opposite to a direction of the first hook and extending through the slot of the fastener and engaging with the orifice of the second arm; and a driving means composed of two separated arms respectively correspond to the first arms of the pair of fasteners, each arm defining a first end and a second end, said second end defining an aperture therein and having a curved portion formed thereon, said curved portion defining a cutout in a tip thereof such that the first hook of the control means extends through the long hole of the fastener and the cutout, and then engages with the aperture, thereby engaging the arm of the driving means with the first arm of the fastener.

2. The device as claimed in claim 1, wherein each of said fasteners has two pairs of plates each extending downward from two side edges thereof said pair of plates positioned to urge a surface of the heat dissipator toward the CPU and closely attach it to the surface of the CPU, after the fastener has engaged with the CPU.

3. The device as claimed in claim 1, wherein each of said fastener further has a pair of wings inclinedly and upwardly extending from the two side edges thereof to retain the fins which are located at two sides of the corresponding channel, after the fastener has engaged with the CPU.

4. The device as claimed in claim 1, wherein each of said control means is configured as a strip.

5. The device as claimed in claim 1, wherein each of said control means is configured as a bar.

6. The device as claimed in claim 1, wherein said driving means further has a transverse strip connected between the first ends of the two arms to simultaneously drive the pair of fasteners.

* * * * *